(12) United States Patent
Crippa et al.

(10) Patent No.: US 11,275,448 B2
(45) Date of Patent: *Mar. 15, 2022

(54) GESTURE RECOGNITION METHOD, CORRESPONDING CIRCUIT, DEVICE AND COMPUTER PROGRAM PRODUCT

(71) Applicant: STMICROELECTRONICS S.r.l., Agrate Brianza (IT)

(72) Inventors: Carlo Crippa, Merate (IT); Rossella Bassoli, Monza (IT)

(73) Assignee: STMICROELECTRONICS S.r.l., Agrate Brianza (IT)

( * ) Notice: Subject to any disclaimer, the term of this patent is extended or adjusted under 35 U.S.C. 154(b) by 0 days.

This patent is subject to a terminal disclaimer.

(21) Appl. No.: 17/116,921

(22) Filed: Dec. 9, 2020

(65) Prior Publication Data

US 2021/0117011 A1 Apr. 22, 2021

Related U.S. Application Data

(63) Continuation of application No. 16/052,379, filed on Aug. 1, 2018, now Pat. No. 10,901,516.

(30) Foreign Application Priority Data

Aug. 2, 2017 (IT) .................. 102017000088977

(51) Int. Cl.
  *G06F 3/01* (2006.01)
  *G06F 9/448* (2018.01)
  (Continued)

(52) U.S. Cl.
  CPC ......... *G06F 3/017* (2013.01); *G05B 19/0426* (2013.01); *G06F 1/163* (2013.01);
  (Continued)

(58) Field of Classification Search
  None
  See application file for complete search history.

(56) References Cited

U.S. PATENT DOCUMENTS

| 4,941,189 A | 7/1990 | Britt |
| 6,742,107 B2 | 5/2004 | Jinzaki |

(Continued)

OTHER PUBLICATIONS

Verma, et al., "Vision based Hand Gesture Recognition Using Finite State Machines and Fuzzy Logic", *2009 International Conference on Ultra Modern Telecommunications & Workshops*, 2009, 6 pages.

(Continued)

*Primary Examiner* — Brian M Butcher
(74) *Attorney, Agent, or Firm* — Seed IP Law Group LLP

(57) ABSTRACT

A programmable data processing circuit is configured for receiving sensor signals indicative of gestures for identification by the processing circuit. The processing circuit applies to the sensor signals finite state machine processing resources to provide identification output signals indicative of gestures identified as a function of the sensor signals. A plurality of finite state machine processing programs loaded into the processing circuit include a data section and an instruction section. The data section including a fixed size part specifying respective processing resources used by the programs in the plurality of finite state machine processing programs and a variable size part with respective sizes for allocating the respective processing resources used by the programs in the plurality of finite state machine processing programs. The instruction section including conditions and commands for execution by the respective processing resources used by the programs by operating on data located in the respective data sections.

20 Claims, 2 Drawing Sheets

(51) Int. Cl.
*G06F 1/16* (2006.01)
*G05B 19/042* (2006.01)
*G01R 33/00* (2006.01)
*G01C 19/02* (2006.01)
*G01P 15/00* (2006.01)
*G05B 23/02* (2006.01)

(52) U.S. Cl.
CPC ........... *G06F 9/4498* (2018.02); *G01C 19/02* (2013.01); *G01P 15/00* (2013.01); *G01R 33/00* (2013.01); *G05B 23/0235* (2013.01); *G05B 2219/23021* (2013.01); *G05B 2219/24012* (2013.01); *G05B 2219/25428* (2013.01); *G05B 2219/35444* (2013.01)

(56) References Cited

U.S. PATENT DOCUMENTS

| | | | |
|---|---|---|---|
| 9,218,064 | B1 | 12/2015 | Li et al. |
| 9,354,709 | B1 | 5/2016 | Heller et al. |
| 10,901,516 | B2 * | 1/2021 | Crippa .................... G06F 3/017 |
| 2009/0273571 | A1 | 11/2009 | Bowens |
| 2009/0307175 | A1 | 12/2009 | Francesco et al. |
| 2010/0001949 | A1 | 1/2010 | Shkolnikov et al. |
| 2011/0179380 | A1 | 7/2011 | Shaffer et al. |
| 2011/0179386 | A1 | 7/2011 | Shaffer et al. |
| 2011/0179387 | A1 | 7/2011 | Shaffer et al. |
| 2011/0181526 | A1 | 7/2011 | Shaffer et al. |
| 2012/0078839 | A1 | 3/2012 | Laaksonen et al. |
| 2012/0133579 | A1 | 5/2012 | Prieur et al. |
| 2013/0067443 | A1 | 3/2013 | Howard |
| 2014/0031123 | A1 | 1/2014 | Sarrafzadeh et al. |
| 2014/0361982 | A1 | 12/2014 | Shaffer |
| 2017/0192514 | A1 | 7/2017 | Karmon et al. |
| 2017/0192665 | A1 | 7/2017 | Karmon |
| 2018/0329505 | A1 * | 11/2018 | Takahashi ........... G06F 3/04883 |
| 2018/0335922 | A1 | 11/2018 | Nilo et al. |
| 2019/0166030 | A1 | 5/2019 | Chen et al. |
| 2019/0178980 | A1 | 6/2019 | Zhang et al. |

OTHER PUBLICATIONS

Reinstadt, et al., "The future of smart devices: contextual awareness", EE Times, published Dec. 16, 2019, retrieved Oct. 19, 2020, <https://www.eetimes.com/the-future-of-smart-devices-contextual-awareness/>.

* cited by examiner

GESTURE RECOGNITION METHOD, CORRESPONDING CIRCUIT, DEVICE AND COMPUTER PROGRAM PRODUCT

BACKGROUND

Technical Field

The description relates to signal processing methods.

One or more embodiments may apply to gesture recognition, for instance in devices such as smart phones or watches.

Description of the Related Art

In recent times, an increasing interest has been brought to recognizing simple gestures involved in using hand-held/portable devices such as smart phones or smart watches. Picking-up a phone, flip up-down movements, shakes, tap-tap etc. or wrist tilt may be exemplary of such gestures.

Sensors such as micro electro-mechanical systems (MEMS) applied to smart phones or watches can detect several simple gestures that a user may wish to identify.

In principle, each (type of) gesture can be recognized by writing a dedicated finite state machine (FSM) procedure or program.

For instance, document US 2012/0078839 A1 describes FSM-based apparatus which includes at least one processor and at least one memory including computer program code. The at least one memory and the computer program code may be configured, with the at least one processor, to cause the apparatus to at least receive an indication of sensor data descriptive of movement of a user terminal, provide for expansion of the sensor data in a predetermined manner to define outcome values, apply a logical mask to the outcome values to generate selected outcome values for provision to a finite state machine, and utilize a pattern recognition algorithm associated with the finite state machine to determine whether the sensor data corresponds to a pattern identified by proceeding through defined transitions to a final state of the finite state machine.

BRIEF SUMMARY

Adopting a FSM-based approach may involve addressing various issues, such as:
- operation may be limited to only one FSM running at a time; admitting plural concurrent programs would be desirable,
- data/resources for each FSM program may not be managed smartly enough,
- operation may be limited to only a single sensor (e.g., an accelerometer).

Despite the extensive activity in the area discussed in the foregoing, improved solutions are desirable in order to overcome various drawbacks.

For instance, each gesture should be desirably recognized by writing a dedicated FSM program with an assembly interpreter running on a small microcontroller decoding the FSM programs loaded into a RAM and execute them in real-time at each input signal sample; however, in so doing various issues may arise:
- being able to detect/recognize, in addition to (many) known gestures, also (new) gestures which may occur in the future would be a desirable feature;
- letting FSM programs be variable (not fixed) in number and have different sizes would be another desirable feature;
- each FSM program may involve different resources (i.e. thresholds, counters, timeouts, . . . ) and different sensor signals (accelerometers, gyroscopes, magnetometers); being able to manage and store those resources and input signals independently for each FSM program would represent still another desirable feature.

An object of one or more embodiments is to contribute in providing such an improved solution.

According to one or more embodiments, such an object can be achieved by means of a method having the features set forth in the claims that follow.

One or more embodiments may relate to a corresponding circuit.

One or more embodiments may relate to a corresponding device (e.g., a hand-held, wearable or portable device).

One or more embodiments may include a computer program product loadable in the memory of at least one programmable data processing circuit and including software code portions implementing finite state machine processing programs according to one or more embodiments. As used herein, reference to such a computer program product is understood as being equivalent to reference to a computer-readable medium containing instructions for controlling a programmable data processing circuit in order to co-ordinate implementation of a method according to one or more embodiments. Reference to "at least one programmable data processing circuit" is intended to highlight the possibility for one or more embodiments to be implemented in modular and/or distributed form.

The claims are an integral part of the technical teaching provided herein in respect of the invention.

One or more embodiments may concern a compact FSM procedure as regards both data and instructions.

One or more embodiments can operate with plural FSMs running at the same time by admitting a variable size data/resource structure complying with individual procedures.

One or more embodiments facilitate overcoming limitations as to the total size (instructions and data), e.g., fixed to 32 bytes (16+16), thus permitting a high degree of freedom in terms of sizes: for instance, in one or more embodiments a data structure can be conceived where (only) those data/resources involved in certain program are stored, thus avoiding a rigid, fixed partition.

One or more embodiments can recognize various gestures of a user of, e.g., a smart phone by resorting to short procedures hosted in a RAM, which may run concurrently in real time and can be decoded by an interpreter resident, e.g., in a microcontroller.

In one or more embodiments, a "smart" arrangement of data/instructions facilitates developing gesture recognition programs (FSMs) which may differ significantly from each other at a (very) low cost in terms of RAM occupation.

In one or more embodiments, notionally no limitations apply to the number of FSMs that can run together, with only factors such as the physical size of the RAM hosting them, microcontroller speed vs. sample rate and the number of output registers storing results and interrupts coming into play: in one or more embodiments, the structure by itself will be compatible with an indefinite number of concurrent FSMs.

One or more embodiments may apply to gesture recognition in combination with MEMS sensors.

One or more embodiments may apply to gesture recognition in smart phones and watches.

One or more embodiments facilitate developing a flexible, efficient, and effective method of writing and storing FSMs, each one capable of recognizing a specific pattern.

A user of one or more embodiments may store, e.g., in a RAM, a certain list of FSMs which are concatenated one after the other and related to those gestures which are desired to recognized.

One or more embodiments may address the problem of managing different resources and inputs for each FSM by structuring the respective FSM procedures in two sections of variable sizes, namely a "data" section and an "instruction" section.

In one or more embodiments, such a data section can define a set of data/resources involved and allocate a corresponding memory space.

In one or more embodiments, such a data section can include a fixed size data section, where the user may specify resources involved, and a variable size data section to reserve space for the resources.

In one or more embodiments, such an instruction section can be provided including a list of instructions to recognize a gesture pattern.

In one or more embodiments, the arrangement discussed in the foregoing may result in an efficient data and instruction structure which, on the one hand, facilitates running applications on a (very) simple microprocessor having limited memory and processing resources and, on the other hand, provides flexibility, programmability, open system features along with efficiency and effectiveness in terms of RAM occupation.

One or more embodiments may offer one or more of the following advantages:
  a smart organization of data/instructions facilitates developing gesture recognition procedures (FSMs) which may differ appreciably from each other with a (very) low cost in terms of RAM occupation: these procedures can run concurrently in real time and be decoded by an interpreter running on a (very) small microcontroller;
  a low-cost solution is provided for gesture recognition, e.g., in a smart phone/watch system which is very effective and open to development;
  a variable data section can provide flexibility and efficiency with respect to RAM occupation;
  "customization" of FSM procedures by a user is facilitated.

One or more embodiments may provide an appreciable improvement over conventional solutions where FSM-based gesture recognition involves running only one procedure at a time.

In one or more embodiments, both instructions and data can be organized in an efficient manner in a structure open to future development and/or capable of managing signals from plural sensors (e.g., accelerometer, gyroscope speed/angle, magnetometer).

One or more embodiments facilitate describing to potential users, e.g., in a datasheet, how to write FSM programs. Also, knowing the start address of a list of FSM programs in RAM, the RAM content (if not encrypted) can be read and data/instruction organization accessed, e.g., for test and checking purposes.

One or more embodiments may be suited to be integrated in a (single) semiconductor device along with one or more sensors (e.g., MEMS) and an assembly interpreter (running, e.g., on a small microcontroller) configured to decode the FSM procedures loaded in a RAM and execute them concurrently in real-time at each input signal sample.

One or more embodiments may however apply to applications running on external, possibly more powerful processors, e.g., depending on application requirements.

BRIEF DESCRIPTION OF THE SEVERAL VIEWS OF THE DRAWINGS

One or more embodiments will now be described, by way of example only with reference to the annexed figures, wherein.

DETAILED DESCRIPTION

Figure 1:
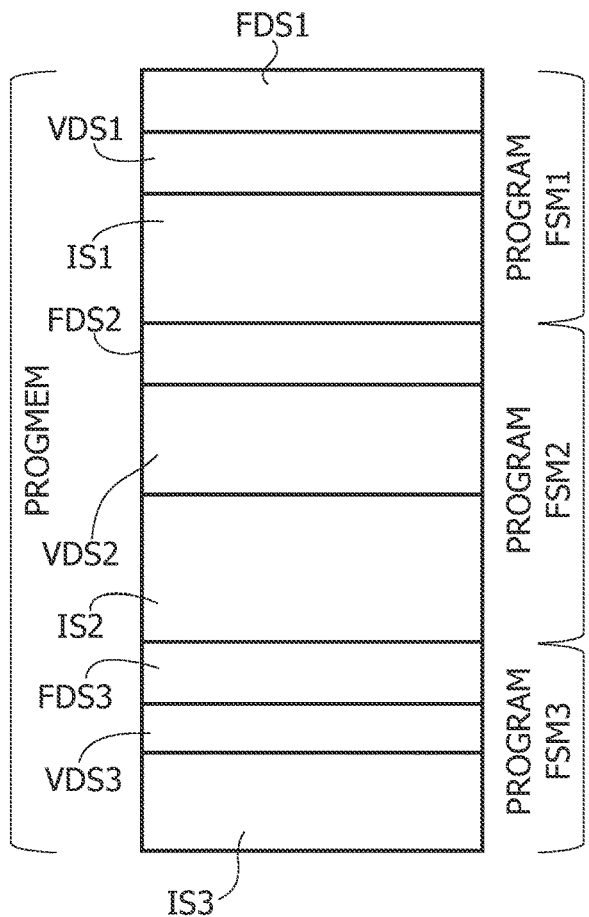
FIG. 1 is a functional diagram exemplary of embodiments.

In the ensuing description, one or more specific details are illustrated, aimed at providing an in-depth understanding of examples of embodiments of this description. The embodiments may be obtained without one or more of the specific details, or with other methods, components, materials, etc. In other cases, known structures, materials, or operations are not illustrated or described in detail so that certain aspects of embodiments will not be obscured.

Reference to "an embodiment" or "one embodiment" in the framework of the present description is intended to indicate that a particular configuration, structure, or characteristic described in relation to the embodiment is comprised in at least one embodiment. Hence, phrases such as "in an embodiment" or "in one embodiment" that may be present in one or more points of the present description do not necessarily refer to one and the same embodiment. Moreover, particular conformations, structures, or characteristics may be combined in any adequate way in one or more embodiments.

The references used herein are provided merely for convenience and hence do not define the extent of protection or the scope of the embodiments.

As noted, gestures involved in using a hand-held, wearable or portable device (e.g., a smart phone or a smart watch) can be detected by sensors (e.g., micro electro-mechanical systems—MEMS) with each (type of) gesture recognizable by a dedicated finite state machine (FSM) procedure or program.

As discussed in the introductory portion of this description, the criteria and principles of operation of such procedures or programs for applying to sensor signals (e.g., accelerometer and/or gyroscope) finite state machine processing to provide gesture identification (recognition) are known per se, this making it unnecessary to provide a detailed description herein.

For instance, an FSM program can recognize the crossing of a threshold by a sensor signal or detect a signal peak, the time duration of an event, a zero-crossing event, and so on. These events can facilitate recognizing a specific phone/watch movement done by the user, generating an interrupt signal and driving an application SW, e.g., to trigger a consequent action.

One or more embodiments aim at facilitating developing compact FSM program/data structures suitable to be integrated in semiconductor devices, and which are easily programmable, customizable and open to future development.

In addition to the ability of detecting/recognizing gestures which are known, the ability of detecting/recognizing new gestures that may occur in the future will be a desirable feature. Avoiding having necessarily to "hardcode" the FSM programs and letting a user customize them may facilitate achieving that goal, e.g., by FSM programs which are not fixed in number and have different sizes.

Another issue to consider is that each FSM program may involve different resources (i.e. thresholds, counters, timeouts,) and different sensors signals (accelerometers, gyroscopes, magnetometers). Managing and storing those resources and input signals for each FSM program independently will thus be a further desirable feature.

Finally a (very) low-cost environment, with FSM programs involving reduced RAM occupation (RAM semiconductor area is a significant factor in terms of cost for MEMS sensor processing devices) represents a further goal to pursue.

Developing a compact FSM program/data structure suitable to be integrated in semiconductor devices, and which is easily programmable, customizable and open to future developments thus represents a technical challenge.

One or more embodiments as discussed in the following may provide a gesture recognition procedure compatible with use of a controller such as a ST Mems Controller (STMC), available from companies of the group of the applicant company, which can be enabled with an enable bit (e.g., in the ALGO register) and can be performed through a plurality of programmable finite state machines (FSMs).

The structure of this procedure can be rendered a highly modular one: a user can easily write a plurality of FSM programs (e.g., up to sixteen, this being otherwise a purely exemplary value) each devoted to recognizing a certain gesture.

The FSM programs can be concatenated one after the other to produce a sort of "array of arrays" namely a memorized collection of programs (hereinafter, this concatenation of plural programs will be named PROGMEM for brevity). Similarly, in the following, the various programs will also be referred to briefly as "FSMs".

In embodiments as exemplified herein, programs include (are composed of) two parts, a data section and an instruction section.

In turn a data section will include:
a fixed length part (fixed data section or FDS), present in all the programs, and
a variable length part (variable data section or VDS), with a size specific for each program.

In one or more embodiments as exemplified herein, the instruction section (i.e. the executable part) IS in turn includes conditions and commands, the latter possibly involving parameters to be executed.

FIG. 1 is exemplary of a PROGMEM including three programs, namely FSM1, FSM2 and FSM3, each including:
a fixed data section, FDS1, FDS2 and FDS3, respectively;
a variable data section VDS1, VDS2 and VDS3, respectively;
an instruction section IS1, IS2 and IS3, respectively.

One or embodiments may include a gesture recognition procedure, e.g., in the form of an interpreter configured for decoding instructions in an instruction section IS1, IS2 or IS3 of a certain program (e.g., FSM1, FSM2 or FSM3) and execute the program by operating on data located in the respective data section.

In one or more embodiments, each program intended to recognize a certain gesture (e.g., FSM1, FSM2 or FSM3—of course referring to three of them is merely exemplary and non-limiting of the embodiments) realizes a simple, programmable FSM and is totally independent from other programs.

As repeatedly noted previously, the criteria and principles of operation of such procedures or programs for applying to sensor signals (e.g., accelerometer and/or gyroscope) finite state machine processing to provide gesture identification (recognition) are known per se. The detailed description provided herein will thus primarily disclose exemplary embodiments which facilitate developing compact program/data structures for such programs which are suitable to be integrated and are easily programmable, customizable and open to future development.

Figure 2:
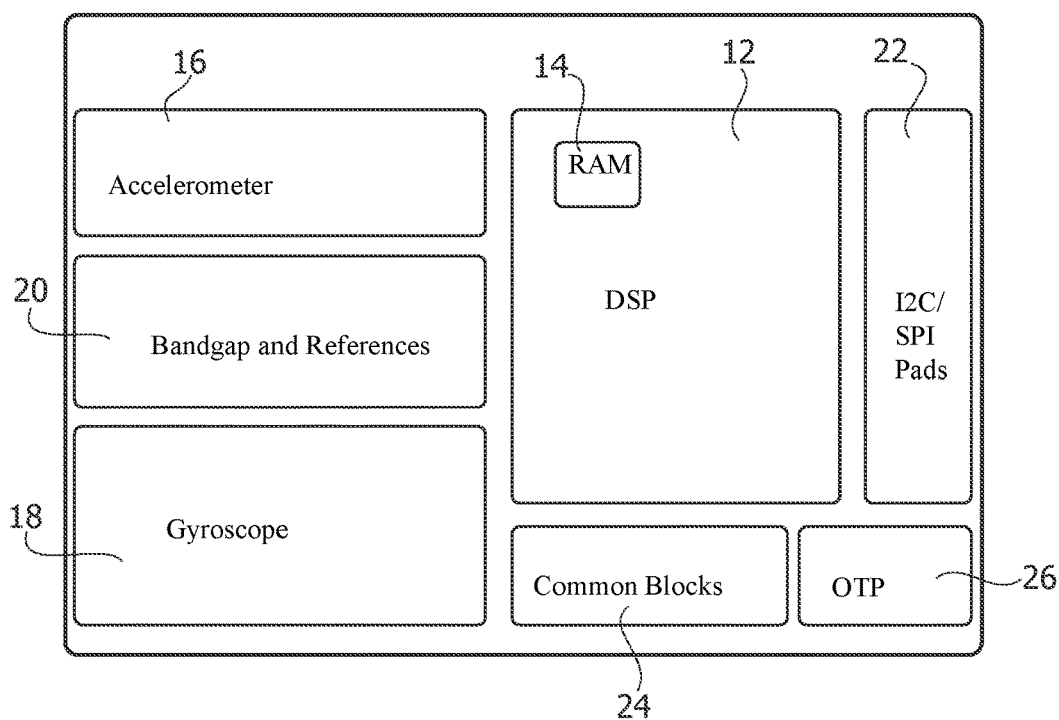
FIG. 2 is a block diagram exemplary of a system according to embodiments.

FIG. 2 is a block diagram of a system configured for operating according to one or more embodiments.

In one or more embodiments as exemplified in FIG. 2, such a system (designated 10 as a whole) includes:
a circuit block 12 performing digital signal processor (DSP) and other digital functions and including a RAM 14;
one or more sensors such as, e.g., an accelerometer 16 and/or a gyroscope 18 with associated bandgap and references 20,
a set of interface pads 22,
common blocks of various types (e.g., activation/deactivation, power control, and so on designated 24 as a whole,
a one time programmable (OTP) memory 26 (e.g., a flash memory), once programmable in production.

It will be otherwise understood that the list above is merely exemplary: certain parts or elements listed above may not be mandatory and/or other parts or elements may be present in addition or as an alternative to the parts or elements listed.

The exemplary representation in FIG. 2 refers to embodiments integrated in a (single) semiconductor device 10 along with one or more sensors (e.g., MEMS) with an assembly interpreter (running, e.g., on microcontroller circuitry at 12) decoding the FSM procedures loaded in the RAM 14 and executing them concurrently in real-time at each input signal sample from the sensor or sensors, e.g., 16, 18.

As noted, one or more embodiments may however apply to applications running on external, possibly more powerful processors, e.g., depending on the application.

In embodiments as exemplified herein, the instruction section (e.g., IS1, IS2, IS3) is the operative part of the respective FSM (e.g., FSM1, FSM2, FSM3: for that reason instructions are sometimes referred to as "states") and includes conditions and commands. Each condition is coded, e.g., in one byte, optionally with the highest nibble coding a reset condition, and the lowest nibble coding a next condition.

In embodiments as exemplified herein, a condition includes one line of code; any time a program is executed, each condition may be evaluated in both its parts, i.e. reset and next.

The following priority scheme may be adopted:
if a reset condition is true, the code is restarted from the beginning,
if a next condition is true, execution progresses to the next line of code,
in case neither of the above is true, the next sample is waited for and both conditions are evaluated again later.

In one or more embodiments, a reset pointer may store the beginning of the code; otherwise it can also be set to whatever state.

In one or more embodiments, two bytes in the fixed data section (FDS1, FDS2, FDS3) store the address of the reset instruction and the address of the current instruction, i.e. the program pointer, respectively. The program pointer is updated any time a next condition is true or forced to the reset address in case a reset condition is true.

In one or more embodiments as exemplified herein, a condition is coded over four bits, so that up to sixteen different conditions can be coded.

One or more embodiments may contemplate three types of conditions, namely timeouts, threshold comparisons and zero crossing detection, which may be handled, e.g., as follows:

timeout conditions are true when a counter, preset with a timeout value, reaches zero;

threshold comparisons are true when enabled inputs (such as accelerometer XYZ axis or norm $V=\sqrt{X^2+Y^2+Z^2}$) are higher (or lower) than a programmed threshold;

a zero crossing detection is true when an enabled input crosses the zero.

For instance, in one or more embodiments, if a counter has not reached zero yet or an enabled input is not yet higher (or lower) than a programmed threshold, or no zero crossing event has been detected, then the condition is false and the program pointer is not updated: when the next input sample arrives the conditions are evaluated again till one of the two (reset or next) becomes true.

Figure 3:
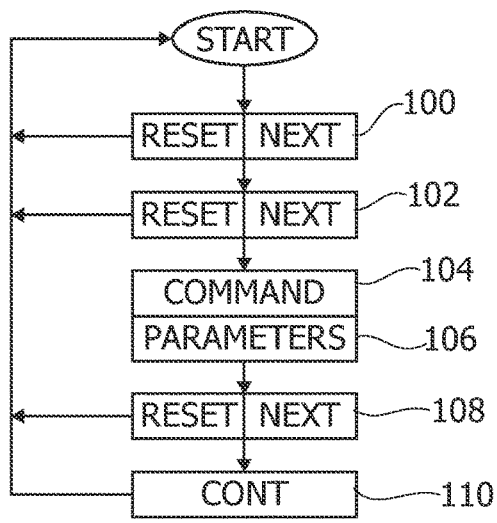
FIG. 3 is a flow chart exemplary of possible acts in embodiments.

The flow chart of FIG. 3 is exemplary of an instruction section (e.g., IS1, IS2, IS3) in a program including three conditions 100, 102, 108 and two commands 104, 106 (e.g., after condition 102 and before condition 108) with command 106 including parameters.

In the (purely exemplary) case presented herein, when a program reaches the end it will output a result and will restart again because of a continuation command CONT represented by block 110 in FIG. 3. In certain cases it can even stop after a first execution.

As illustrated in Table 1 reproduced in the following, for the exemplary case considered here there are sixteen possible conditions.

Table 1 is exemplary of certain resources being possibly involved in "building" conditions, such as, e.g.:

timeouts for a time counter,
thresholds for comparison with input signals,
masks to enable (trigger) input signal comparisons v. thresholds,
input signals sign storing to allow zero cross detection In one or more embodiments, these resources can be allocated in the variable data sections (e.g., VDS1, VDS2, VDS3) and can differ from one FSM to another.

TABLE 1

| | CONDITION | DESCRIPTION |
|---|---|---|
| 0x0 | NOP | No execution - condition on current sample |
| 0x1 | TI1 | Timeout 1 expired |
| 0x2 | TI2 | Timeout 2 expired |
| 0x3 | TI3 | Timeout 3 expired |
| 0x4 | TI4 | Timeout 4 expired |
| 0x5 | GNTH1 | Any triggered axis > THRS1 |
| 0x6 | GNTH2 | Any triggered axis > THRS2 |
| 0x7 | LNTH1 | Any triggered axis <= THRS1 |
| 0x8 | LNTH2 | Any triggered axis <= THRS2 |
| 0x9 | GLTH1 | All triggered axis > THRS1 |

TABLE 1-continued

| | CONDITION | DESCRIPTION |
|---|---|---|
| 0xA | LLTH2 | All triggered axis <= THRS2 |
| 0xB | GRTH1 | Any triggered axis >- THRS1 |
| 0xC | LRTH1 | Any triggered axis >- THRS2 |
| 0xD | PZC | Any triggered axis crossed zero pos. slope |
| 0xE | NZC | Any triggered axis crossed zero neg. slope |
| 0xF | ZC | Any triggered axis crossed zero |

As further discussed in a following section of this description (devoted to fixed and variable data sections), in the fixed data section (FDS, e.g., FDS1, FDS2, FDS3) a user may declare resources desired to be allocated to a certain FSM.

As exemplified in FIG. 3, the instruction section of a program may include commands in addition to conditions.

In one or more embodiments, commands can be identified by codes that would be meaningless as conditions.

Table 2 reproduced in the following shows an exemplary command table listing a complete set of commands and related parameters.

TABLE 2

| | COMMAND | DESCRIPTION | PARAMETERS |
|---|---|---|---|
| 0x00 | STOP | Stop execution and wait new start from reset-point | None |
| 0x11 | CONT | Continues execution from reset-point | None |
| 0x22 | CONTREL | Continues execution from reset-point and reset temporary mask | |
| 0x33 | SRP | Set reset-point to next address/state | None |
| 0x44 | CRP | Clear reset-point to first program line | None |
| 0x55 | SETP | Set parameter in the program memory | byte 1 address, byte 2 value |
| 0x66 | SELMA | Select MASKA and TMASKA as current mask | None |
| 0x77 | SELMB | Select MASKB and TMASKB as current mask | None |
| 0x88 | SELMC | Select MASKC and TMASKC as current mask | None |
| 0x99 | OUTC | Write the temporary mask to output register | None |
| 0xAA | STHR1 | Set new value to THRESH1 | byte 1 and byte 2 values |
| 0xBB | STHR2 | Set new value to THRESH2 | byte 1 and byte 2 values |
| 0xCC | SELTHR1 | Select THRESH1 instead of THRESH3 | None |
| 0xDD | SELTHR3 | Select THRESH3 instead of THRESH1 | None |
| 0xEE | SISW | Swap sign information to opposite in selected mask | None |
| 0xFF | REL | Reset temporary mask to default | None |
| 0x12 | SSIGN0 | Set UNSIGNED comparison mode | None |
| 0x13 | SSIGN1 | Set SIGNED comparison mode | None |
| 0x14 | SRTAM0 | Do not reset temporary mask after a next condition true | None |
| 0x21 | SRTAM1 | Reset temporary mask after a next condition true | None |
| 0x23 | SIN_SEL | Set input multiplexer | byte 1 value |
| 0x24 | STIMER3 | Set new value to TIMER3 register | byte 1 value |
| 0x31 | STIMER4 | Set new value to TIMER4 register | byte 1 value |
| 0x32 | SWAPMSK | Swap mask selection MASKA <=> MASKB; MASKC unaffected | None |

TABLE 2-continued

| COMMAND | | DESCRIPTION | PARAMETERS |
|---|---|---|---|
| 0x34 | INCR | Increase long counter +1, check timeout and manage clear | None |
| 0x41 | JMP | Jump address for two Next conditions | byte 1 conditions, byte 2 and 3 jump addresses |

Table 3 reproduced in the following is a table exemplary of the instruction section of a program, grouping (mixing) conditions and commands.

TABLE 3

| STATE 0 | NOP | GNTH1 | Go to next state if enabled input is greater than TH1; otherwise wait |
| STATE 1 | LNTH1 | TI3 | Stay over TH1 for TI3 seconds; if goes down before then restart from STATE 0 |
| STATE 2 | | OUTC | After TI3 seconds output temporary mask and interrupt |
| STATE 3 | | SRP | Set reset pointer to STATE 4 |
| STATE 4 | NOP | LNTH1 | Go to next state if triggered input is lower than TH1; otherwise wait |
| STATE 5 | GNTH1 | TI3 | Stay under TH1 for TI3 seconds; if goes up before, then restart from STATE 4 |
| STATE 6 | | CRP | After TI3 seconds clear reset pointer to STATE0 |
| STATE 7 | | CONTREL | Output temporary mask and interrupt, reset temporary mask and continue from STATE 0 |

A reset/next condition or a command, possibly followed by parameters, can represent an instruction (program state), which facilitates building the instructions section of a program.

An exemplary set of commands will be described in the following.

For instance, STOP, CONT and CONTREL are suited to control the end of a program.

In the first case, the FSM interpreter (e.g., in 12 in FIG. 2) will stop the execution, while in the other cases it will restart from the reset point; in case of CONTREL a temporary mask can be reset to default.

The STOP command stopping program execution will cause a resulting mask to be output, with an interrupt (if enabled) generated and, e.g., '1' written in a flag STOPDONE, e.g., in a location CONFIG_B (see also the following discussion of CONFIG_A and CONFIG_B).

This behavior will otherwise be transparent to the user; in order to re-enable a program once stopped, a user may disable and enable the correspondent bit in a FSM_E-NABLE register.

In one or more embodiments, a SETP command can be used to set whatever location in a program. This can be followed by two parameters: the address of the byte to be modified and the value to be loaded. Judicious use of such command may be advisable insofar as possible wrong addresses may undesirably corrupt system memory.

One or more embodiments may include a JMP command with three bytes as parameters; the first being a double condition, while the second one and the third one represent jump addresses in case a "left" or "right" condition becomes true, respectively. This is a case of double condition in which a reset condition is not present and a next condition is replaced by two conditions with dedicated jump addresses.

For instance, if the left condition is true, then the program jumps to the first address; if the right condition is true it jumps to the second address; if both conditions are false it waits for a next sample and re-evaluates the conditions again.

This command can be managed by the interpreter (e.g., at 12 in FIG. 2) by an internal flag JMP of CONFIG_B that is reset once one of the jump conditions has become true.

In one or more embodiments a gesture recognition procedure may provide for the presence of a "long" counter (LC) that can be read and cleared, e.g., by Inter-Integrated Circuit ($I^2C$)/Serial Peripheral Interface (SPI) protocols/interfaces (see, e.g., 22 in FIG. 2).

For instance, a timeout can be programmed with an input parameter LC_TIMEOUT and, by a command INCR, it may be incremented every time such a command is executed. When the counter reaches the timeout, an interrupt INT_FSM_LC may be generated and managed, e.g., like all other STMC interrupts.

The "long" counter can be cleared by a user by activating a bit LC_CLEAR in a register FSM_LC_CLEAR, so that the next time an INCR command is found, the FSM interpreter will proceed to clearing the counter and issue an LC_CLEARED flag as a response to the clear request, which can be read via $I^2C$/SPI from the register FSM_LC_CLEAR. This bit can be polled in order to ascertain if the clear operation has been completed: once this bit becomes active the I2C/SPI can de-assert the LC_CLEAR request, allowing the counter to count again when a successive INCR command will be found, while the interpreter will de-assert the response flag LC_CLEARED.

If a program uses a long counter, the bit LC in the location CONFIG_B can be set to '1'.

In one or more embodiments as exemplified herein, the interpreter (e.g., in 12 in FIG. 2) is configured for decoding instructions and executing them with actions based on data stored in the data section.

In one or more embodiments as exemplified herein, each program implementing an FSM and able to recognize a certain gesture may have its own, independent data set.

By referring, purely by way of example, to the exemplary instruction section discussed previously, certain data as exemplified in the following may be involved:
threshold 1 value,
timeout 3 value,
a mask to enable a certain axis out of XYZV to trigger events,
a timer to count waiting times Those listed above are exemplary of data (also named resources) expected to be used more frequently.

In one or more embodiments, other data which can be possibly declared and used in addition or in alternative to the foregoing may include:
at least one hysteresis value, which may be added/subtracted to/from threshold values when performing "greater than"/"lower than" comparisons;
a decimation mechanism, which may be applied in case the FSM is executed not at each and every input sample but at a lower frequency; in these cases, e.g., two bytes can be reserved, one with the decimation value and the other for a decimation counter;
a previous axis sign (PAS), which can be declared and used in case a zero crossing condition ZC, PZC, NZC is present in the instructions section, e.g., to store the signs of previous input samples XYZV;

memory locations to store, e.g., gyroscope integrated angles and output data rate (ODR) period duration when using a FSM with such input data.

It will be appreciated that the list reported in the foregoing is merely exemplary, insofar as simpler programs can use fewer data and more complex programs can use more data (e.g., plural thresholds, timeouts and/or masks).

Fixed data sections (e.g., FDS1, FDS2, FDS3 in FIG. 1) may facilitate obtaining an efficient and effective data-instruction structure.

For instance, a fixed data section FDS such as FDS1, FDS2, FDS3 included in all the programs facilitates storing information about the amount of resources used by a program: a user can fill it and reserve memory locations accordingly in the variable data section VDS.

Tables 4A-4B reproduced in the following are exemplary of a possible implementation of a fixed data section including, e.g., six bytes storing information about the data variable section and the instructions section.

TABLE 4A

| | NAME | 7 | 6 | 5 | 4 |
|---|---|---|---|---|---|
| 0 | CONFIG A | NR_THRESH(1:0) | | NR_MASK(1:0) | |
| 1 | CONFIG B | DES | HYST | ANGLE | PAS |
| 2 | SIZE | PROGRAM SIZE(7:0) | | | |
| 3 | SETTINGS | MASKSEL(1:0) | | SIGNED | R_TAM |
| 4 | RP | RESET POINTER(7:0) | | | |
| 5 | PP | PROGRAM POINTER(7:0) | | | |

TABLE 4B

| | NAME | 3 | 2 | 1 | 0 |
|---|---|---|---|---|---|
| 0 | CONFIG A | NR_LTIMER(1:0) | | NR_TIMER(1:0) | |
| 1 | CONFIG B | ENDOUT | ///// | LC | ///// |
| 2 | SIZE | PROGRAM SIZE(7:0) | | | |
| 3 | SETTINGS | THRS3SEL | | IN_SEL(2:0) | |
| 4 | RP | RESET POINTER(7:0) | | | |
| 5 | PP | PROGRAM POINTER(7:0) | | | |

For instance, these six bytes can be present at the beginning of each program realizing an FSM for gesture recognition.

The first two bytes store the amount of resources used by the program.

For instance, CONFIG_A makes it possible to declare 0-3 thresholds (NR_THRESH), 0-3 masks (bits NR_MASK), 0-2 long (16 bits) timeouts (bits NR_LTIMER), 0-2 short (8 bits) timeouts (bits NR_TIMER).

Conversely, CONFIG_B makes it possible for a user to declare if, e.g.:
- decimation is desired to be applied to the incoming ODR (bit DES),
- hysteresis is desired to be used (bit HYST),
- gyroscope angles are desired to be computed and stored (bit ANGLE), and/or
- zero crossing instructions are used and previous axis signs are intended to be saved (bit PAS).

A field LC can be used to inform the interpreter that the program is using a long counter, as discussed previously, with resource allocation not directly affected.

A byte designated SIZE can be provided to store the length in bytes of the whole program, e.g. both data and instruction sections. Per se, this information may have no meaning for the FSM itself, but can be used by the interpreter to proceed more easily from one program to a following one.

Finally, RP and PP can be used to store a reset address pointer and a program address pointer, respectively, the program address pointer being the address within the program of the instruction (condition or command) under execution during a current sample time.

In one or more embodiments, the reset pointer can be selected to correspond to the first instruction of a program and can be modified during execution, e.g., by respective commands SRP and CRP. As shown, the first command can set the reset pointer to the following instruction, while the second command can set the pointer again to the first program instruction, i.e. state zero.

One or more embodiments may provide for the program pointer PP being set to 0x00 by the user when a program is loaded to the RAM; the interpreter can thus exploit this information to set it (in the starting phase, together with the reset pointer RP) to the first line of the instruction section, which facilitates a "clean" start every time an FSM is enabled.

Other fields of CONFIG_B as well as of SETTINGS bytes may be used for storing configuration bits which do not affect the variable data section size. For instance, the command IN_SEL may facilitate making a selection among different possible input signals, e.g.:

000: accelerometer
$[a_x\ a_y\ a_x\ a_v]$
001: gyroscope
$[g_x\ g_y\ g_z\ g_v]$
010: calibrated magnetometer
$[m_x\ m_y\ m_z\ m_v]$
011: high-pass filtered signal from, e.g., an external filtering section such as a block external to the FSM configured for filtering the input signal to the FSM
$[h_x\ h_y\ h_z\ h_v]$
100: low-pass filtered signal from, e.g., an external filtering section
$[l_x\ l_y\ l_z\ l_v]$
101: high-pass filtered signal norm from, e.g., an external filtering section
$[0\ 0\ 0\ V_l]$
110: low-pass filtered signal norm from, e.g., an external filtering section
$[0\ 0\ 0\ V_l]$
111: integrated gyroscope signal
$[d_x\ d_y\ d_z d_v]$ One or more embodiments may provide for the fields in the CONFIGB and SETTINGS lines 1 and 3 in Table 4B where an underscoring appears (e.g., /////) being excluded from direct availability to the user; for instance, these fields can be managed through dedicated commands in the program code (for instance a command SIN_SEL can be dedicated to set the correct input signal, a command SELMA to select a mask MASKA as current mask, etc . . . ). To that effect, the bits in the "underscored" fields in Table 4B can be set to default values by the interpreter when a program starts. This point will be further addressed in the following.

In one or more embodiments, masks can be used in the variable data sections (e.g., VDS1, VDS2, VDS3) to enable one axis XYZV in the input data, selected, e.g., by IN_SEL in SETTINGS in Table 4, to be considered in a threshold comparison condition or in zero crossing detection.

In one or more embodiments, masks can be used for that purpose having the following layout:

| X+ | X− | Y+ | Y− | Z+ | Z− | V+ | V− |
|---|---|---|---|---|---|---|---|

For example, a mask 0xCC may take into account axes X and Z, and their reversed versions X- and Z-, for the next threshold comparison or zero crossing detection. At each sample, in case a condition involves it, a comparison can be made following a priority scheme from left to right. For instance, the first enabled axis to satisfy the condition (i.e. that triggers an event) may become the (only) axis checked against thresholds in the following conditions, unless this behavior is changed with dedicated commands.

For instance, if not specifically requested, the original mask will in practice become a new temporary mask, with only one bit active, that will be used in the following threshold comparisons. For that reason, each mask may include two bytes, one for the original and one for the temporary mask.

For instance, in one or more embodiments, a temporary mask can be reset to the original:
 any time there is a reset condition "true" when executing a CONTREL command;
 when executing a REL command;
 after each true next condition, if a SRTAM1 command has been previously issued.

In one or more embodiments, for a mask declared with NR_MASK inside CONFIG_A, a user will be able to reserve, e.g., two bytes in the program variable data section (e.g., VDS1, VDS2, VDS3); during a starting procedure, e.g., just after an FSM has been enabled, the interpreter will copy a value for each programmed mask in the related temporary mask as a starting mask.

One or more embodiments make it possible to declare, e.g., three masks, say MASKA, MASKB and MASKC, with MASKA being a default mask at program start.

Commands may also be provided to facilitate control of mask usage. For instance:
 SELMA, SELMB and SELMC to select a desired pair of original/temporary mask;
 REL, SRTAM0 and SRTAM1 to manage possible reset of a temporary mask to an original mask;
 SWAPMSK may concern (only) MASKA and MASKB; e.g., if MASKA is currently selected as running mask, MASKB can be forced instead and vice-versa. MASKC remains unaffected;
 SISW may swap the value of the current temporary mask between each pair of +/- axes. As a result of this command, for instance, a temporary mask of 0x80 (X+ triggering) may become 0x40 (X- triggering).

For instance, a temporary mask currently selected may be output whenever a command OUTC is executed. In case of STOP or CONT commands, if the bit ENDOUT is, e.g., "1", the temporary mask is loaded to the OUTS register corresponding to the program; if "0" the OUTS register is not modified.

In one or more embodiments as exemplified herein, a program has associated an output register OUTS which can be read, e.g., by an I$^2$C interface and contain a temporary mask, as well as an interrupt bit that can be set in the registers INT1_CTRL and INT2_CTRL as is conventional for algorithms running on STMC.

Thresholds can be used in order to check and validate values of input signals.

An event is said to be "triggered" if a result of an input signal, enabled by a current mask, satisfies a threshold requirement.

In one or more embodiments, the possibility exists of declaring, e.g., three thresholds, named THRESHOLD1, THRESHOLD2 and THRESHOLD3; storing a threshold may involve, e.g., two bytes in half-precision floating point (HFP) format. For instance, for a threshold declared with NR_THRESH in CONFIG_A, two bytes can be reserved by a user in the PROGRAM variable data section.

The condition table discussed previously shows (all) possible comparisons that can be used in the instructions section. In the arrangement exemplified therein (only) THRESHOLD1 and THRESHOLD2 can be used for threshold comparison. In case THRESHOLD3 is declared, THRESHOLD3 can be used in the place of THRESHOLD1 whenever a SELTHR3 command is executed. The user can switch back to THRESHOLD1 by using a SELTHR1 command.

In one or more embodiments, a comparison can be performed by taking into account a hysteresis value; if the user sets bit HYST in CONFIG_B then comparisons of the kind ">" can be executed by adding a hysteresis value to the threshold. Conversely, comparisons of the kind "<=" can be executed by subtracting a hysteresis value from the threshold. The user can reserve two bytes in the variable data section for the hysteresis values (possibly different from each other), and fill it with, e.g., a half precision floating point format value, if declared by bit HYST.

Figure 4:
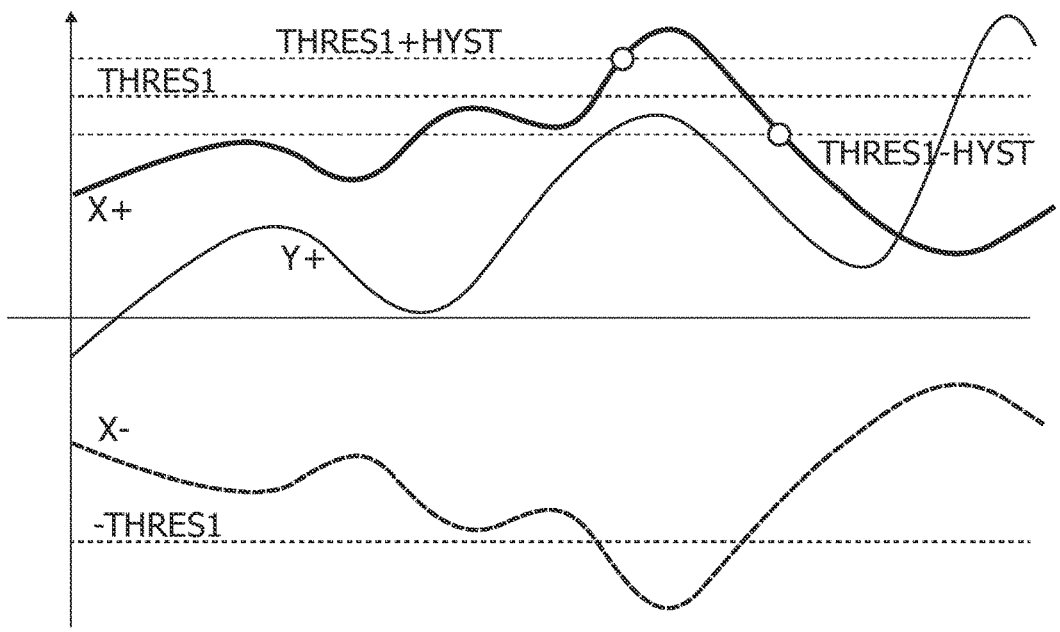
FIGS. 4 and 5 are diagrams exemplary of events possibly occurring in embodiments.

FIG. 4 shows by way of example, two events triggered by an input signal X+ in case of a GNTH1 (THRES1+HYST) and subsequently by LNTH1 (THRES1−HYST) with hysteresis enabled.

The original mask is assumed to be 0xC0. Even Y+ falling below the threshold before X+ will not result in any trigger action since the temporary mask has already been assigned to X+ thanks to the first triggered event. A reversed threshold—THRES1 can be used when executing conditions like LRTH1 or GRTH1.

In one or more embodiments, these thresholds can be modified during program execution, e.g., by means of commands STHR1 and STHR2, with these two commands followed by, e.g., two bytes storing a new threshold value in HFP format.

In case of data from an accelerometer such as, e.g., 16 in FIG. 2, by assuming that values are in "g" units (i.e. 9.81 m/s$^2$), a threshold can be set by referring to an angle between the vertical and a given axis: for instance measuring on an axis a static acceleration of 1 g means that the axis is parallel to the vertical. Lower values acc denote an angle of the axis with respect to the vertical direction that can be computed as:

$$a=\arccos(acc)*180/\pi$$

One or more embodiments may contemplate two different modes for comparing signals and thresholds, that is a signed mode or an unsigned mode.

In a signed mode, signals and thresholds keep their original sign in the comparison (the threshold can also be negative); in unsigned mode, the comparison is made between the absolute values of both signal and threshold.

The signed mode can be the default comparison mode in one or more embodiments; commands such SSIGN0 and SSIGN1 may permit to set the unsigned mode and to return to the signed mode during program execution.

One or more embodiments facilitate writing a program by using input signals from different sensors, such as accelerometer, gyroscope and magnetometer signals or filtered signals from, e.g., an external filtering algorithm. A command such as SIN_SEL makes it possible to select (even at run time) a different input, with a different mask selected via SELMB and a next threshold comparison performed between, for instance, a gyroscope signal and a related threshold in rad/sec.

One or more embodiments may contemplate other kinds of events triggered by a timeout reached by a counter.

For instance, using a counter in a program facilitates events duration management, with, e.g., two kinds of timeout usage adapted to be declared in CONFIG_A, a long timeout or a short timeout.

The former option and the latter option may involve 16-bit and 8-bit counting values, respectively: e.g., with long timeouts designated TI1 and TI2 and short timeouts designated TI3 and TI4.

The output data rate or ODR (or its decimated version, if enabled) may be used as a time basis, so that programming counter timeouts may be in terms of ODR cycles.

For instance (the quantitative data provided herein are merely for exemplary purposes and have no limiting intent of embodiments) with an accelerometer signal sampled at 25 Hz, that is with a 40 ms cycle, a short timeout can cover up to 255*0.04=10.2 sec, which represents a fairly long time for gesture recognition. However, in case of an ODR of, say, 1600 Hz, that is with a 625 nanosecond cycle, a short counter can cover only about 160 ms; a long timeout instead can reach 40.95 sec.

The number and kind of desired timeouts can be set, e.g., in CONFIG_A with fields NR_LTIMER and NR_TIMER; for instance (only) up to two counters per kind can be declared.

The variable data section makes it possible for a user to reserve a certain amount of bytes to store timeout values intended to be used, possibly along with, e.g., one or two bytes to be used as a counter memory for the PROGRAM.

In an exemplary case where only short timeouts are declared, then one byte for a counter TC can be reserved; if also long timeouts are declared, then two bytes can be reserved for the counter TC.

In one or more embodiments, long timeouts TI1 and TI2 can be used also with eight bit timeouts, e.g., if up to four short timeouts are involved; the counter TC can be configured to be two byte wide, with usage of a long counter declared adapted to be automatically associated by the interpreter to a two byte counter TC.

In one or more embodiments, commands STIMER3 and STIMER4 can be provided in order to modify runtime the values of, e.g., short timeouts.

A third class of events can be generated by detecting when a signal crosses, e.g., a zero level.

Figure 5:
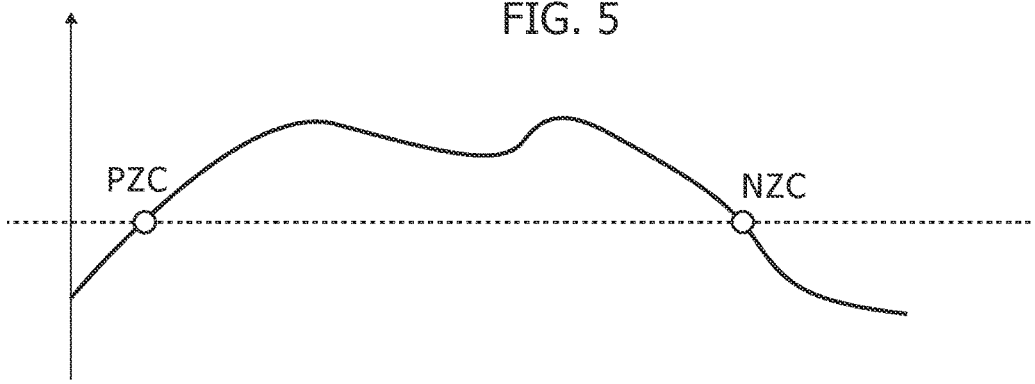

For instance, conditions can be set which make it possible to detect zero crossing events as a result of a triggered signal crossing a certain level (hereinafter the zero level will be considered for simplicity, but the disclosure applies per se also to levels different from the zero level) with a positive slope (PZC) or a negative slope (NZC) or with both events (ZC) as schematically shown in FIG. 5. The condition table discussed above shows these codes.

Level (e.g., zero) crossing detection as exemplified herein does not rely on hysteresis; however, determining zero crossing events can involve storing the signs of the previous sample axis XYZV.

In one or more embodiments, when a program includes PZC, NZC or ZC conditions, a PAS (previous axis sign) resource can be allocated for that purpose by the user; in addition to enabling a PAS bit in CONFIG_B, one byte to store the previous axis sign can be reserved in the variable data section. For instance the lower nibble of PAS will store the sign of the previous input sample XYZV irrespective of the input selected by IN_SEL.

It was observed that certain gesture recognition programs may require fairly high output data rate (ODR) values.

In one or more embodiments, several programs can coexist at a same time and a mechanism of ODR decimation can be provided, in order to execute a "slow" program according to a programmed decimation factor.

In the presence of a program involving a decimated ODR, a user can set a bit DES in CONFIG_B, reserve, e.g., two bytes DEST and DESC in the variable data section for this function, and initialize DEST to the decimation factor.

For example (again, the quantitative data provided herein are merely for exemplary purposes and have no limiting intent of embodiments) if the main ODR is 1600 Hz and a specific program is intended to be run at 25 Hz, then DEST can be set, e.g., to 80 (0x50). The interpreter will use the first byte, DEST, as timeout and the second, DESC, as a countdown timer; any time the counter reaches zero the program will be executed and the counter DESC reloaded with the value programmed in DEST.

In the above example:
over 79 samples the interpreter of the program involved will only decrement DESC,
at the $80^{th}$ sample it will set again DESC=0x50 and execute the instruction pointed by the program pointer.

A lowest meaningful value for DEST can be 2, meaning that a program is intended to be executed every two samples.

In one or more embodiments, a group of bytes in the variable data section can be possibly reserved if a bit ANGLE in CONFIG_B is active. This may be the case for a program using integrated gyroscope data (i.e. angles) as an input signal.

For that purpose, e.g., five double bytes can be reserved in the variable data section to store an ODR cycle time DELTAT and the four angles DX, DY, DZ, DV, e.g., in HFP format.

Angle calculation can be cleaned any time a reset or next condition is true, with angular velocity integration re-started from zero at the next sample.

After discussing possible arrangements of data resources which can be exploited in one or more embodiments, the data section of a program, including both fixed data sections (e.g., FDS1, FDS2, FDS3) and variable data sections (VDS1, VDS2, VDS3), will now be discussed.

By referring to an example already discussed, one may consider the program as per Table 5 below. In principle this may regarded as a program involving one threshold (therefore one mask) and one short timeout for execution.

TABLE 5

| STATE 0 | NOP | GNTH1 |
|---|---|---|
| STATE 1 | LNTH1 | TI3 |
| STATE 2 | | OUTC |
| STATE 3 | | SRP |
| STATE 4 | NOP | LNTH1 |
| STATE 5 | GNTH1 | TI3 |
| STATE 6 | | CRP |
| STATE 7 | | CONTREL |

A whole corresponding exemplary program is exemplified in Table 6 reproduced below, which shows:
a fixed data section FDS (essentially lines 0 to 5, in plain font with some fields in lines CONFIGB and SETTINGS highlighted with underscoring for the reasons explained below),
a variable data section VDS (e.g., lines 6 to 11 in italics font), and
an instruction section IS (e.g., lines 12 to 19, in italics underscored font).

TABLE 6

|   |              | 7     | 6     | 5     | 4     | 3     | 2     | 1     | 0     |
|---|--------------|-------|-------|-------|-------|-------|-------|-------|-------|
| 0 | CONFIG A     |       |       | 01    |       | 01    |       | 00    | 01    |
| 1 | CONFIG B     | 0     | 0     | 0     | 0     | 1     | ///// | 0     | ///// |
| 2 | SIZE         |       |       |       | 00010100 |    |       |       |       |
| 3 | SETTINGS     | ///// | ///// | ///// | ///// | ///// | ///// | ///// | ///// |
| 4 | RP           |       |       |       | 00000000 |    |       |       |       |
| 5 | PP           |       |       |       | 00000000 |    |       |       |       |
| 6 | THRESHOLD1_LSB |     |       |       | 00000000 |    |       |       |       |
| 7 | THRESHOLD1_MSB |     |       |       | 00111000 |    |       |       |       |
| 8 | MASKA        | 1     | 0     | 0     | 0     | 0     | 0     | 0     | 0     |
| 9 | TMASKA       | 0     | 0     | 0     | 0     | 0     | 0     | 0     | 0     |
| 10 | TC          |       |       |       |       |       |       |       |       |
| 11 | TI3         |       |       |       | 00001111 |    |       |       |       |
| 12 | NOP  GNTH1  |       |       |       | 00000101 |    |       |       |       |
| 13 | LNTH1  TI3  |       |       |       | 01110011 |    |       |       |       |
| 14 | OUTC        |       |       |       | 10011001 |    |       |       |       |
| 15 | SRP         |       |       |       | 00110011 |    |       |       |       |
| 16 | NOP  LNTH1  |       |       |       | 00000111 |    |       |       |       |
| 17 | GNTH1  TI3  |       |       |       | 01010011 |    |       |       |       |
| 18 | CRP         |       |       |       | 01000100 |    |       |       |       |
| 19 | CONTREL     |       |       |       | 00100010 |    |       |       |       |

Threshold 1 can be assumed to be, e.g., 0.5 g, which is 0x3800 in HFP format, with TI3, e.g., 600 ms, i.e. 0x0F at 25 Hz ODR to a total of 20 bytes, 12 for data and 8 for instructions: once more, the quantitative data provided herein are merely for exemplary purposes and have no limiting intent of embodiments.

In one or more embodiments as exemplified herein, the bits with underscoring in certain lines in the fixed data section FDS can be set by the interpreter to default values when a program starts and are not filled in by the user. The PP field is filled with 0x00 so that the interpreter may recognize the beginning of program execution and run a start routine as described in the following.

Certain details will now be discussed concerning program (FSM) writing.

For instance, useful guidelines for a user may include the following.

i) Write the instructions section with conditions and commands representative of gestures to be recognized.

ii) Evaluate the resources used in program writing (thresholds, masks, short and/or long timeouts, decimation, hysteresis, angle computation, PAS for zero crossing detection).

iii) Configure the fixed data section FDS (e.g., a fixed number of six bytes) as follows:

CONFIG_A: fill the fields with the resources needed

CONFIG_B: fill the fields with resources needed and set the bit ENDOUT and LC as desired SIZE: fill it after completing the variable data section with the total bytes of data+instructions SETTINGS: 0x00 (managed by the starting routine)

RP: 0x00 (managed by the starting routine)

PP: 0x00 (as noted, this may be fixed in order to facilitate execution of a starting routine)

iv) Configure the variable data section VDS by reserving locations for the resources involved as declared in CONFIG_A and CONFIG_B.

Table 7 reproduced in the following shows a data section of a program declaring use all the resources available. This provides a good example of the order in which the data are stored; the user can design the variable data section map by removing from a table as shown below those resources which are not used, and keeping the order as shown in the table.

TABLE 7

|   | Amount | Bytes per resource | Total bytes |
|---|--------|--------------------|-------------|
| Fixed part | | | 6 |
| Thresholds | 0-3 | 2 | 0 to 6 |
| Hysteresis | No - Yes | 2 | 0 or 2 |
| Masks | 0-3 | 2 | 0 to 6 |
| Angle (DELTAT, DX, DY, DZ, DV) | No - Yes | 10 | 0 or 10 |
| Time counter | No - Yes | 1 or 2 | 0 or 1 or 2 |
| Long timeouts | 0-2 | 2 | 0 to 4 |
| Short timeouts | 0-2 | 1 | 0 to 2 |
| Decimation (DEST and DESC) | No - Yes | 2 | 0 or 2 |
| PAS (for zero crossing detection) | No - Yes | 1 | 0 or 1 |

In one or more embodiments as exemplified in Table 8 below, a longest possible amount of data section bytes can be 41 bytes: e.g., 3 thresholds, hysteresis, 3 masks, 2 long timeouts, 2 short timeouts, decimation, zero crossing and angle.

TABLE 8

|   |          | 7 | 6 | 5 | 4 | 3 | 2 | 1 | 0 |
|---|----------|---|---|---|---|---|---|---|---|
| 0 | CONFIG A | NR_THRESH (1:0) | | NR_MASK (1:0) | | NR_LTIMER (1:0) | | NR_TIMER (1:0) | |
| 1 | CONFIG B | DES | HYST | ANGLE | PAS | ENDOUT | ///// | LC | ///// |
| 2 | SIZE     | PROGRAM SIZE(7:0) | | | | | | | |
| 3 | SETTINGS | MASKSEL(1:0) | | SIGNED | R_TAM | THRS3SEL | | IN_SEL(2:0) | |
| 4 | RP       | RESET POINTER(7:0) | | | | | | | |
| 5 | PP       | PROGRAM POINTER(7:0) | | | | | | | |
| 6 | THRESH1  | THRESH1(15:0) | | | | | | | |
| 7 |          | | | | | | | | |
| 8 | THRESH2  | THRESH2(15:0) | | | | | | | |
| 9 |          | | | | | | | | |
| 10 | THRESH3 | THRESH3(15:0) | | | | | | | |
| 11 |         | | | | | | | | |
| 12 | HYST    | HYSTERESIS(15:0) | | | | | | | |
| 13 |         | | | | | | | | |
| 14 | MASKA   | MASKA(7:0) | | | | | | | |
| 15 | TMASKA  | TMASKA(7:0) | | | | | | | |
| 16 | MASKB   | MASKB(7:0) | | | | | | | |
| 17 | TMASKB  | TMASKB(7:0) | | | | | | | |
| 18 | MASKC   | MASKC(7:0) | | | | | | | |
| 19 | TMASKC  | TMASKC(7:0) | | | | | | | |

TABLE 8-continued

|    |         | 7 | 6 | 5 | 4 | 3 | 2 | 1 | 0 |
|----|---------|---|---|---|---|---|---|---|---|
| 20 | DELTAT  | \multicolumn{8}{c|}{DELTAT(15:0)} |
| 21 |         |   |   |   |   |   |   |   |   |
| 22 | DX      | \multicolumn{8}{c|}{DX(15:0)} |
| 23 |         |   |   |   |   |   |   |   |   |
| 24 | DY      | \multicolumn{8}{c|}{DY(15:0)} |
| 25 |         |   |   |   |   |   |   |   |   |
| 26 | DZ      | \multicolumn{8}{c|}{DZ(15:0)} |
| 2  |         |   |   |   |   |   |   |   |   |
| 28 | DV      | \multicolumn{8}{c|}{DV(15:0)} |
| 29 |         |   |   |   |   |   |   |   |   |
| 30 | TC      | \multicolumn{8}{c|}{TC(15:0) or TC(7:0)} |
| 31 |         |   |   |   |   |   |   |   |   |
| 32 | TIMER1  | \multicolumn{8}{c|}{TIMER1(15:0)} |
| 33 |         |   |   |   |   |   |   |   |   |
| 34 | TIMER2  | \multicolumn{8}{c|}{TIMER2(15:0)} |
| 35 |         |   |   |   |   |   |   |   |   |
| 36 | TIMER3  | \multicolumn{8}{c|}{TIMER3(7:0)} |
| 37 | TIMER4  | \multicolumn{8}{c|}{TIMER4(7:0)} |
| 38 | DEST    | \multicolumn{8}{c|}{DEST(7:0)} |
| 39 | DESC    | \multicolumn{8}{c|}{DESC(7:0)} |
| 40 | PAS     | — | — | — | — | SIGN_X | SIGN_Y | SIGN_Z | SIGN_V |

Operation of one or more embodiments (e.g., operation of the interpreter) may be facilitated by each program having an even number of lines (data and instructions). Such a feature is otherwise non-mandatory.

In one or more embodiments, as a result of a FSM being enabled, a starting routine is executed by the interpreter (e.g., 12 in FIG. 2).

For instance, the routine is executed if the PP field is set to 0.

This routine can perform the following tasks, which may be completely transparent to the user:
  preset the PP and RP pointer to the first line of code;
  assign to all declared temporary masks the value of the corresponding original mask;
  if timeouts are declared, then the time counter is reset, e.g., to 0;
  if decimation is declared, the decimation counter is preset with the programmed decimation time value;
  if a previous axis sign is declared, then this is reset, e.g., to 0;
  if gyroscope angle computation is declared, then the four angles are reset, e.g., to 0;
  the field SETTINGS is loaded with a default value, e.g., 0x20;
  the associated output register OUTS is cleared;
  if bit LC in CONFIG_B is active, the long counter is reset;
  the flags STOPDONE and JMP in CONFIG_B are reset.

By running a starting routine a FSM can (always) be restarted from a known state, independently of the way it has been stopped.

In one or more embodiments a default mode may imply, e.g.:
  MASKA selected as running mask;
  signed comparison mode;
  temporary mask not released after a next condition is true;
  Threshold1 selected in the place of Threshold3 for comparisons;
  input multiplexer set to select accelerometer data.

If a program involves, e.g., an unsigned comparison mode, then using a SSIGN0 command as first state in the code may be advisable.

Whenever a command making changes in the data is used as an instruction (for example STHR1 to modify threshold1 value from value1 to value 2) writing the same command with the starting threshold1=value1 at the beginning of the code represents a wise choice.

This is a safe approach, insofar as the FSM could have been stopped previously after Threshold1 modification to value2. A restart with a wrong value (value2) may then occur in the absence of such reprogramming.

In one or more embodiments, certain fields can be reset to known values by the starting routine, while other fields can be managed adequately by a user in writing the program.

After completing writing the FSMs, certain parameters can be loaded to the data RAM, e.g.:
  a long counter timeout value in parameter LC_TIMEOUT;
  the number of FSMs actually implemented (1-16) in parameter PROGRAM_NR;
  the starting address in the data RAM of the PROGMEM collection in parameter PROGMEM_START.

In embodiments where a program uses magnetometer data as input, the user can program hard-iron and soft-iron correction factors. These parameters, stored, e.g., in the RAM 14 in FIG. 2, facilitate executing a magnetometer calibration routine applied to the incoming data. If calibration data are not available, an option may involve inserting 0 for hard-iron compensation and an identity matrix for soft-iron coefficients.

In one or more embodiments, an I$^2$C/SPI register FSM_ENABLE can be accessed in order to start or stop the various implemented FSMs; the enable bits in the register can be assigned individually to each FSM following the order in which they are stored inside PROGMEM.

In one or more embodiments, setting, e.g., to '0' the corresponding bit in FSM_ENABLE may permit to stop a FSM if desired.

In one or more embodiments, similarly to the enable bits in FSM_ENABLE, also OUTS output registers and FSM interrupts (both control and status bits) can be assigned individually to each program, e.g., following their concatenation order in the PROGMEM collection. For instance a fourth program in PROGMEM will have an associated enable bit FSM4_ENABLE in the FSM_ENABLE register, an output OUTS4, interrupt control bits INT1_FSM4 in the INT1_CTRL register and INT2_FSM4 in the INT2_CTRL register and an interrupt status IS_FSM4 in the INT_STATUS register.

By way of further example, one may consider the case of a FSM for wrist tilt, e.g., a particular program/FSM recognizing a wrist tilt gesture adapted to be hardcoded and made immediately available to the user. Assuming, again by way of example, that a STMC controller is used for that purpose, after RAM clearing, a routine can be executed in order to copy the wrist tilt PROGRAM at a fixed address in the RAM (e.g., 14 in FIG. 2).

A method according to one or more embodiments may include:

providing a programmable data processing circuit (e.g., 12) configured for receiving sensor signals (e.g., from 16, 18) indicative of gestures for identification by the data processing circuit and applying to the sensor signals finite state machine processing resources to provide gesture identification output signals (e.g., 22) indicative of gestures identified as a function of the sensor signals, loading (e.g., into RAM 14) into the data processing circuit (12) a plurality (e.g., PROGMEM) of (e.g., concatenated) finite state machine processing programs (e.g., FSM1, FSM2, FSM3), wherein the programs include:

a data section (e.g., FDS1, VDS1; FDS2, VDS2; FDS3, VDS3) in turn including a fixed size part (e.g., FDS1, FDS2, FDS3) specifying respective processing resources used by the programs in the plurality of finite state machine processing programs and a variable size part (e.g., VDS1, VDS2, VDS3) with respective sizes for allocating the respective processing resources used by the programs in the plurality of finite state machine processing programs, and an instruction section (e.g., IS1, IS2, IS3) including conditions and commands for execution by the respective processing resources used by the programs by operating on data located in the respective data sections.

In one or more embodiments the data processing circuit may include an interpreter configured for decoding instructions in the instruction section of plural programs out of the plurality of finite state machine processing programs and executing said plural programs concurrently by operating on data located in the respective data sections of the plural programs concurrently executed.

In one or more embodiments, the conditions in said instruction section for execution by the respective processing resources may include conditions selected out of:

timeout conditions of counters preset with timeout values; and/or threshold comparisons (e.g., THRES1; −THRES1) applied to the sensor signals; and/or detection of crossing of reference values (e.g., PZC, NZC) by the sensor signals.

In one or more embodiments, data in the respective data section for execution by the conditions in said instruction section may include:

selectively applicable long and short timeout values for the timeout conditions of said counters; and/or threshold values for threshold comparisons applied to the sensor signals; and/or enable masks for threshold comparisons applied to the sensor signals; and/or hysteresis values (e.g., HYST) applicable to threshold values for the threshold comparisons applied to the sensor signals; and/or previous axis signs and/or gyroscope integrated angles applicable to detection of crossing of reference values by the sensor signals.

In one or more embodiments, data in the respective data section for execution by the conditions in said instruction section may include:

a decimation index indicative of samples of the sensor signals to be omitted from finite state machine processing; and/or output data rates to provide the gesture identification output signals.

One or more embodiments may provide for coupling execution parameters to at least one subset of the commands for execution by the respective processing resources.

In one or more embodiments, a programmable data processing circuit may be configured for receiving sensor signals indicative of gestures for identification by the data processing circuit and applying to the sensor signals finite state machine processing resources to provide gesture identification output signals indicative of gestures identified as a function of the sensor signals, and the processing circuit may have a plurality of finite state machine processing programs loaded therein with the method of to one or more embodiments.

In one or more embodiments a device (e.g., 10) may include:

a programmable data processing circuit according to one or more embodiments, at least one gesture sensor providing to the programmable data processing circuit at least one sensor signal indicative of gestures for identification by the data processing circuit.

In one or more embodiments, the at least one gesture sensor may be selected out of an accelerometer, a gyroscope, a magnetometer or combinations thereof.

In one or more embodiments the at least one gesture sensor may include a micro electro-mechanical systems (MEMS) sensor.

In one or more embodiments, the device may include a hand-held, wearable or portable device.

In one or more embodiments a computer program product loadable into a programmable data processing circuit (12) configured for receiving sensor signals indicative of gestures for identification by the data processing circuit and applying to the sensor signals finite state machine processing resources to provide gesture identification output signals indicative of gestures identified as a function of the sensor signals may include software code portions implementing finite state machine processing programs according to one or more embodiments.

Without prejudice to the underlying principles, the details and embodiments may vary, even significantly, with respect to what has been described by way of example only, without departing from the extent of protection.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A method, comprising:
receiving, by a data processing circuit, sensor signals indicative of gestures; and
concurrently executing, by the data processing circuit, a plurality of finite state machine processing programs, generating gesture identification output signals as a function of the sensor signals, wherein:
each of the finite state machine processing programs includes:
a data portion including a fixed size part specifying respective processing resources used by the programs in the plurality of finite state machine processing programs and a variable size part with respective sizes for allocating the respective processing resources used by the programs in the plurality of finite state machine processing programs, and
an instruction portion including conditions and commands for execution by the respective processing resources used by the programs by operating on data located in the respective data portions of the programs; and
the concurrently executing the plurality of finite state machine processing programs comprises operating on data located in the respective data portions of the plurality of finite state machine processing programs.

2. The method of claim 1, wherein the conditions in said respective instruction portions include conditions selected out of:
timeout conditions of counters preset with timeout values;
threshold comparisons applied to the sensor signals;
detection of crossing of reference values by the sensor signals; or
combinations thereof.

3. The method of claim 2, wherein data in the respective data portions include:
selectively applicable long and short timeout values for the timeout conditions of said counters;
threshold values for threshold comparisons applied to the sensor signals;
enable masks for threshold comparisons applied to the sensor signals;
hysteresis values applicable to threshold values for the threshold comparisons applied to the sensor signals;
previous axis signs;
gyroscope integrated angles applicable to detection of crossing of reference values by the sensor signals; or
combinations thereof.

4. The method of claim 1, wherein data in the respective data portions include:
a decimation index indicative of samples of the sensor signals to be omitted from finite state machine processing;
output data rates to provide the gesture identification output signals; or
combinations thereof.

5. The method of claim 1, including coupling execution parameters to at least one subset of the commands for execution by the respective processing resources.

6. The method of claim 1, wherein the input signals comprises:
a high-pass filtered signal;
a high-pass filtered normalized signal;
a low-pass filtered signal;
a low-pass filtered normalized signal; or
combinations thereof.

7. A programmable data processing circuit, comprising:
an input, which, in operation, receives sensor signals indicative of gestures;
a memory, which, in operation, stores a plurality of finite state machine processing programs, wherein each of the programs include:
a data portion including a fixed size part specifying respective processing resources used by the programs in the plurality of finite state machine processing programs and a variable size part with respective sizes for allocating the respective processing resources used by the programs in the plurality of finite state machine processing programs, and
an instruction portion including conditions and commands for execution by the respective processing resources used by the programs by operating on data located in the respective data portions of the programs; and
processing circuitry coupled to the input and to the memory, wherein the processing circuitry, in operation, concurrently executes the plurality of finite state machine processing programs, generating gesture identification output signals as a function of the sensor signals, wherein the concurrently executing the plurality of finite state machine processing programs comprises operating on data located in the respective data portions of the plurality of finite state machine processing programs.

8. The programmable data processing circuit of claim 7 wherein the conditions in said instruction portions include:
timeout conditions of counters preset with timeout values;
threshold comparisons applied to the sensor signals;
detection of crossing of reference values by the sensor signals; or
combinations thereof.

9. The programmable data processing circuit of claim 8, wherein data in the respective data portions included:
selectively applicable long and short timeout values for the timeout conditions of said counters;
threshold values for threshold comparisons applied to the sensor signals;
enable masks for threshold comparisons applied to the sensor signals;
hysteresis values applicable to threshold values for the threshold comparisons applied to the sensor signals;
previous axis signs;
gyroscope integrated angles applicable to detection of crossing of reference values by the sensor signals; or
combinations thereof.

10. The programmable data processing circuit of claim 8 wherein data in the respective data portions include:
a decimation index indicative of samples of the sensor signals to be omitted from finite state machine processing;
output data rates to provide the gesture identification output signals; or
combinations thereof.

11. The programmable data processing circuit of claim 7 wherein at least one subset of the commands are coupled to execution parameters.

12. The programmable data processing circuit of claim 7, comprising a filter coupled to the input, which, in operation, filters one or more of the received sensor signals.

13. A system, comprising:
one or more sensors, which, in operation, generate sensor signals; and a programmable data processing circuit coupled to the one or more sensors, the programmable data processing circuit including:
- a memory, which, in operation, stores a plurality of finite state machine processing programs, wherein each of the programs include:
  - a data portion including a fixed size part specifying respective processing resources used by the programs in the plurality of finite state machine processing programs and a variable size part with respective sizes for allocating the respective processing resources used by the programs in the plurality of finite state machine processing programs, and
  - an instruction portion including conditions and commands for execution by the respective processing resources used by the programs by operating on data located in the respective data portions of the programs; and
- processing circuitry coupled to the memory, wherein the processing circuitry, in operation, concurrently executes the plurality of finite state machine processing programs, generating gesture identification output signals as a function of the sensor signals, wherein the concurrently executing the plurality of finite state machine processing programs comprises operating on data located in the respective data portions of the plurality of finite state machine processing programs.

14. The system of claim 13 wherein the one or more sensors include an accelerometer, a gyroscope, a magnetometer or combinations thereof.

15. The system of claim 13 wherein the one or more sensors include a micro electro-mechanical system (MEMS) sensor.

16. The system of claim 13, comprising a filter coupled between one or more of the one or more sensors and the programmable data processing circuit.

17. A non-transitory computer-readable medium having contents which configure a data processing system to perform a method, the method comprising:

generating sensor signals; and
concurrently executing a plurality of finite state machine processing programs, generating gesture identification output signals as a function of the sensor signals, wherein:
each of the finite state machine processing programs includes:
- a data portion including a fixed size part specifying respective processing resources used by the programs in the plurality of finite state machine processing programs and a variable size part with respective sizes for allocating the respective processing resources used by the programs in the plurality of finite state machine processing programs, and
- an instruction portion including conditions and commands for execution by the respective processing resources used by the programs by operating on data located in the respective data portions of the programs; and
the concurrently executing the plurality of finite state machine processing programs comprises operating on data located in the respective data portions of the plurality of finite state machine processing programs.

18. The non-transitory computer-readable medium of claim 17 wherein the conditions in said respective instruction portions include conditions selected out of:
timeout conditions of counters preset with timeout values;
threshold comparisons applied to the sensor signals;
detection of crossing of reference values by the sensor signals; or
combinations thereof.

19. The non-transitory computer-readable medium of claim 17 wherein the method comprises filtering one or more of the sensor signals.

20. The non-transitory computer-readable medium of claim 17 wherein the contents comprises instructions executed by a processing device of the data processing system.

* * * * *